(12) United States Patent
Ishigaki

(10) Patent No.: US 6,404,024 B1
(45) Date of Patent: Jun. 11, 2002

(54) SEMICONDUCTOR DEVICE

(75) Inventor: Yoshiyuki Ishigaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/517,051

(22) Filed: Mar. 2, 2000

(30) Foreign Application Priority Data

Aug. 30, 1999 (JP) ............................................. 11-243636

(51) Int. Cl.$^7$ .............................................. H01L 29/76
(52) U.S. Cl. ........................ 257/401; 257/392; 257/500; 257/903
(58) Field of Search ................................ 257/391, 392, 257/401, 500, 903; 438/275, 286

(56) References Cited

U.S. PATENT DOCUMENTS

| | | | | |
|---|---|---|---|---|
| 5,285,096 A | * | 2/1994 | Ando et al. ................... | 257/379 |
| 5,455,438 A | * | 10/1995 | Hashimoto et al. .......... | 257/391 |
| 5,488,248 A | | 1/1996 | Lee et al. ..................... | 257/382 |
| 5,600,167 A | * | 2/1997 | Urayama ...................... | 257/335 |
| 5,886,363 A | * | 3/1999 | Hamada et al. ................ | 257/48 |
| 5,969,396 A | * | 10/1999 | Iwasa et al. .................. | 257/408 |
| 6,005,296 A | * | 12/1999 | Chan ............................ | 257/904 |
| 6,037,638 A | * | 3/2000 | Abe et al. ..................... | 257/393 |
| 6,091,106 A | * | 7/2000 | Park .............................. | 257/330 |
| 6,093,946 A | * | 7/2000 | Li et al. ........................ | 257/318 |
| 6,153,907 A | * | 11/2000 | Huang et al. ................. | 257/327 |
| 6,163,054 A | * | 12/2000 | Kim ............................... | 257/344 |
| 6,178,110 B1 | * | 1/2001 | Hayashi ....................... | 365/154 |
| 6,184,588 B1 | * | 2/2001 | Kim et al. ..................... | 257/903 |
| 6,204,538 B1 | * | 3/2001 | Kim .............................. | 257/371 |
| 6,232,642 B1 | * | 5/2001 | Yamazaki .................... | 257/404 |

FOREIGN PATENT DOCUMENTS

| | | | | |
|---|---|---|---|---|
| JP | 4-61377 | | 2/1992 | |
| JP | 4-05-226616 | * | 9/1993 | ................. 257/904 |
| JP | 4-06-097392 | * | 4/1994 | ................. 257/903 |
| JP | 10-144805 | | 5/1998 | |

* cited by examiner

Primary Examiner—Eddie Lee
Assistant Examiner—George C. Eckert, II
(74) Attorney, Agent, or Firm—McDermott, Will & Emery

(57) ABSTRACT

There is described a semiconductor device whose structure is suitable for controlling the threshold values for operation of transistors, as well as for inexpensive fabrication of transistors whose threshold values for operation assume small values. A field-oxide film is formed on a silicon substrate through use of an oxidation-resistance mask, by means of the local oxidation of silicon (LOCOS) method. On the silicon substrate, there is formed an access transistor whose source/drain region is to be formed in active regions and whose channel region is to be formed in another active region. A protuberance is formed in the field-oxide film so as to bulge toward the active region where the channel region is to be formed. A bird's beak, which would grow during the course of formation of the field-oxide film, encounters difficulty in growing in the protuberance, as a result of which a trench is formed in a boundary area between the protuberance and the active region where the channel region is to be formed. The threshold value for the operation of the access transistor is set to a small value, so long as the channel width of the access transistor is set to a small value.

12 Claims, 15 Drawing Sheets

(A)

(B)

(C)

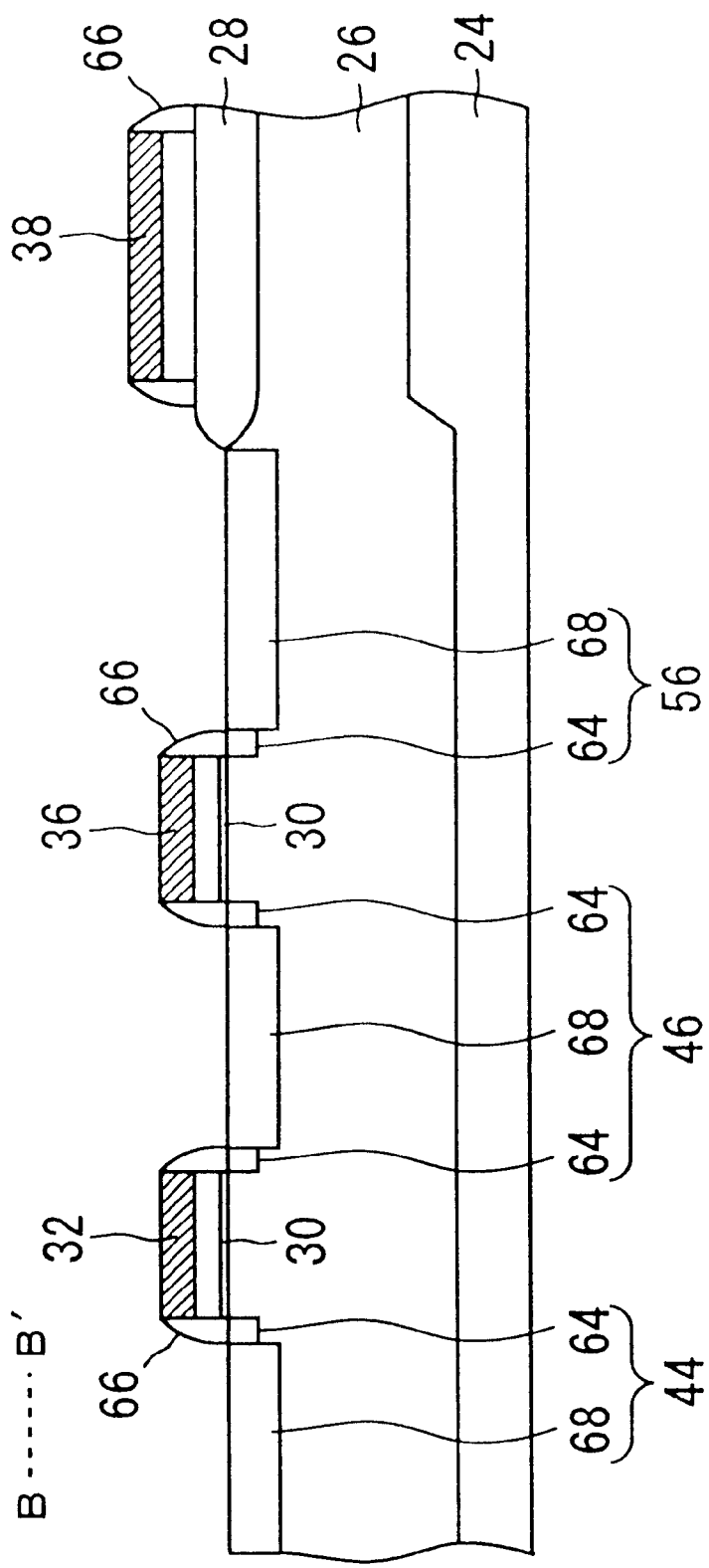

SEMICONDUCTOR DEVICE

BACKGROUND OF THE INVENTION

1. Field of the Invention

The present invention relates to a semiconductor device and a method of manufacturing a semiconductor device, and more particularly, to a semiconductor device whose structure is suitable for reducing a threshold value for the operation of a transistor thereof, as well as a method of manufacturing the semiconductor device.

2. Description of the Background Art

Static random-access memory (SRAM) has been known as one example of a semiconductor device including transistors. SRAM is volatile semiconductor memory and comprises a plurality of bit lines and a word lines, arranged in a matrix pattern, and a plurality of memory cells formed at respective points of intersection of the bit and word lines.

Each memory cell comprises two access transistors and two driver transistors. Each of the two driver transistors is connected to a load element for receiving a power voltage. The load elements and the driver transistors constitute a flip-flop circuit which has two memory nodes and brings the two memory nodes into one of two stable states.

Each of the two access transistors is disposed between the memory node and one of the pair of bit lines. One of the bit line pair will hereinafter be represented as "BIT," and the remaining one of the bit line pair will hereinafter be represented as "/BIT." In SRAM, data are supplied to each memory cell from the bit line pair by way of the access transistors, so that the data are stored in the flip-flop circuit (memory node). On the other hand, the data stored in each memory cell can be read when the potential of the memory node is led to the bit line pair by way of the access transistors.

An effective way to stably activate SRAM is to set a threshold value Vath for the operation of the access transistors to a small value and a threshold value Vdth for the operation of the driver transistors to a large value. For these reasons, as described in Japanese Patent Application Laid-Open No. Hei4-61377, the threshold value Vdth for the operation of the driver transistors is commonly set to become higher than the threshold value Vath for the operation of the access transistors in SRAM.

In conventional SRAM, the threshold value for the operation of a transistor is controlled by the amount of impurities doped into a semiconductor substrate. Specifically, a p-type impurity concentration of an area immediately below the gate electrode of the driver transistor is controlled so as to become greater than the p-type impurity concentration of an area immediately below the gate electrode of the access transistor, thereby rendering the threshold value Vdth greater than the threshold value Vath.

In order to make the concentration of impurities implanted into the semiconductor substrate different from area to area, a photoresist must be patterned such that areas whose impurity concentration is to be reduced are covered with the photoresist, and impurities must be implanted into the semiconductor substrate while the photoresist is taken as a mask. In this respect, the conventional method encounters the problem of increasing costs incurred by manufacture of SRAM.

As the access and driver transistors become miniaturized in association with integration of SRAM, the intervals between the transistors become smaller, thereby diminishing a margin for photolithography. Accordingly, openings to be formed in the photoresist are likely to become formed in the areas where access transistors are to be fabricated. In this case, the threshold value Vath for the operation of the access transistors is increased, so that the operation of SRAM becomes unstable.

SUMMARY OF THE INVENTION

The present invention has been conceived to solve such a problem in the conventional method, and the object of the present invention is to provide a semiconductor device which is suitable for inexpensively fabricating transistors thereof whose threshold value for operation is small, as well as a method of manufacturing a semiconductor device.

The above objects of the present invention are achieved by a semiconductor device having a field-oxide film for insulating a plurality of active regions from one another. The device includes first and second active regions which are to act as source/drain regions of a transistor. The device also includes a third active region which is to be interposed between the first and second active regions and act as a channel region of the transistor. The field-oxide film has a protuberance in a boundary area with the first through third active regions, so as to protrude toward the third active region. A trench is formed in a boundary region between the protuberance and the third active region.

The above objects of the present invention are also achieved by a method of manufacturing a semiconductor device having a field-oxide film which insulates a plurality of active regions from one another. In the inventive method, on a silicon substrate is formed a pad film from a silicon oxide film. An oxidation-resistance mask of predetermined pattern is formed on the pad film. A field-oxide film is formed in areas exposed from the oxidation-resistance mask by means of subjecting the silicon substrate to thermal oxidation. Transistors are fabricated after removal of the oxidation-resistance mask, by utilization of active regions covered by the oxidation-resistance mask. The oxidation-resistance mask is formed in an area which covers a source/drain region and a channel region of a specific transistor, so as to have a concave portion depressing toward the channel region when viewed from above.

Other objects and further features of the present invention will be apparent from the following detailed description when read in conjunction with the accompanying drawings.

BRIEF DESCRIPTION OF THE DRAWINGS

FIGS. 9A to 9C, 10, 11A, 11B, 12A, 12B, 13A, 13B, 14A, and 14B are cross-sectional or plan views for describing a manufacturing method of the SRAM according to the first embodiment;

DESCRIPTION OF THE PREFERRED EMBODIMENTS

Figure 1:
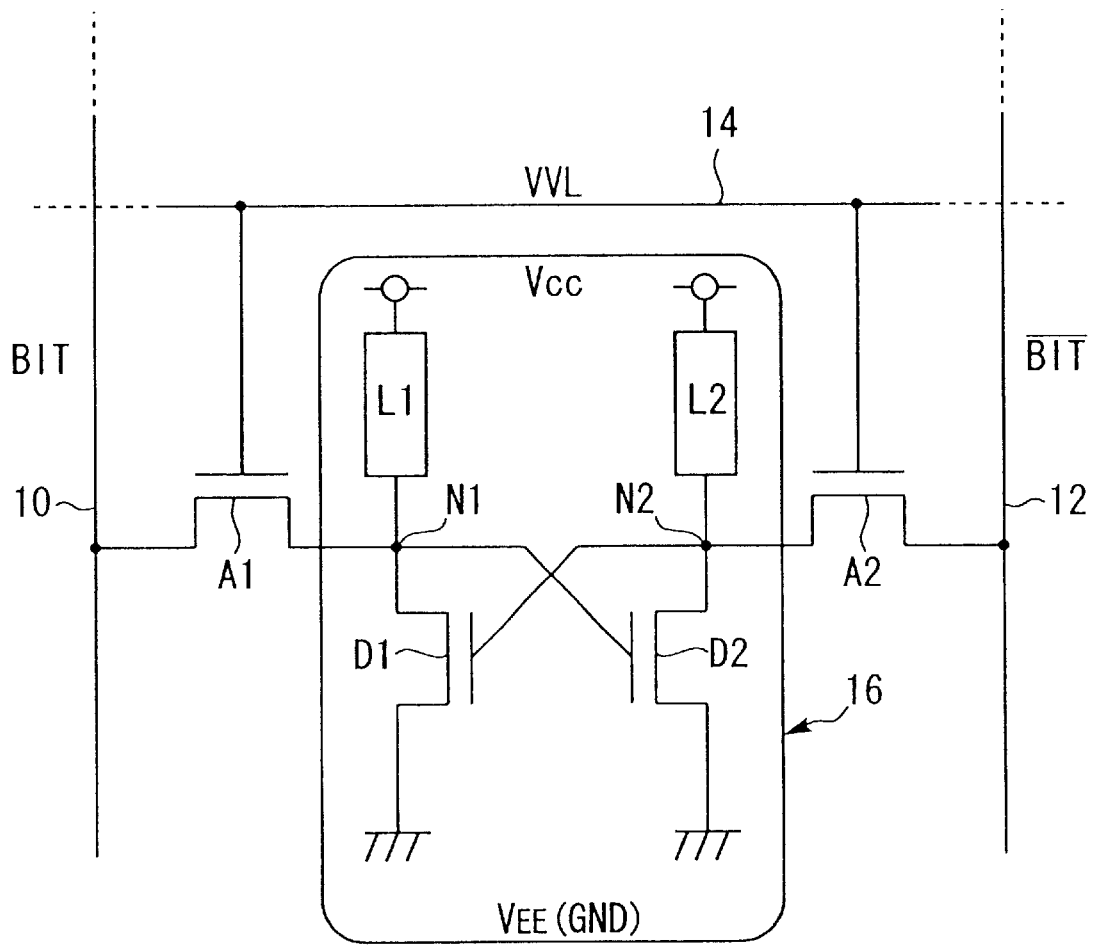
FIG. 1 is a circuit diagram showing an electrical structure of a single memory cell included in common SRAM.

Preferred embodiments of the present invention will be described hereinbelow by reference to the drawings. Elements common among the accompanying drawings are assigned identical reference numerals, and repetitions of their explanations are omitted here for brevity.

First Embodiment

FIG. 1 is a circuit diagram showing the electrical structure of a single memory cell included in common SRAM. The SRAM according to the first embodiment comprises a circuit shown in FIG. 1 for each memory cell. The SRAM shown in FIG. 1 corresponds to volatile semiconductor memory and comprises a plurality of bit and word lines, which are arranged in a matrix pattern. Each memory cell is electrically connected to a pair of bit lines and one word line. Hereinafter, the pair of bit lines electrically connected to the memory cell shown in FIG. 1 are represented as "BIT 10 " and "/BIT 12." A word line electrically connected to the memory cell is represented as "WL 14."

Each memory cell is provided with two access transistors A1 and A2. The gate electrodes of the access transistors A1 and A2 are electrically connected to the word line WL 14. The source/drain regions of the access transistor A1 is electrically connected to the bit line BIT 10 and a memory node N1, and the source/drain regions of the access transistor A2 is electrically connected to the bit line /BIT 12 and a memory node N2.

A supply voltage Vcc is supplied to the memory node N1 by way of a load L1, and the memory node N1 is connected to one of the source/drain regions of a driver transistor D1. Similarly, the supply voltage Vcc is supplied to the memory node N2 by way of a load L2, and the memory node N2 is connected to one of the source/drain regions of a driver transistor D2. A ground potential VEE is supplied to the remaining source/drain regions of the respective driver transistors D1 and D2. The memory node N1 is electrically connected to the gate electrode of the driver transistor D2, and the memory node N2 is electrically connected to the gate electrode of the driver transistor D1.

Figure 2:
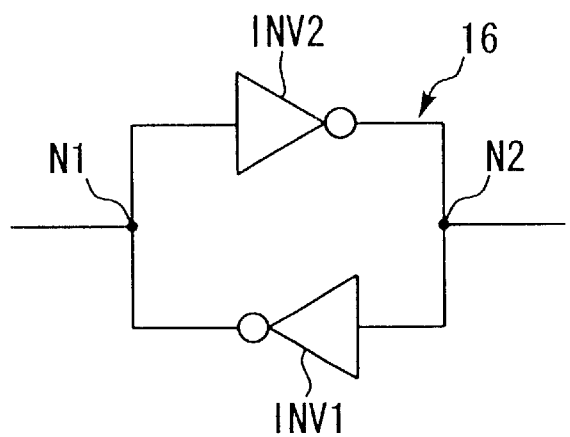
FIG. 2 shows an electrically equivalent circuit of a flip-flop circuit shown in FIG. 1.

FIG. 2 is an electrically equivalent circuit including the loads L1 and L2 as well as the two driver transistors D1 and D2. An inverter circuit INV1 shown in FIG. 2 is equivalent to the load L1 and the driver transistor D1, while an inverter circuit INV2 shown in FIG. 2 is equivalent to the load L2 and the driver transistor D2. The circuitry comprising the loads L1 and L2 and the driver transistors D1 and D2, all of which are shown in FIG. 1 constitute a flip-flop circuit 16. Similarly, the inverter circuits INV1 and INV2 shown in FIG. 2 also constitute the flip-flop circuit 16. This flip-flop circuit 16 brings the memory nodes N1 and N2 into one of two stable states; i.e., (N1=high, N2=low) and (N1=low, N2=high). So long as a predetermined supply voltage is supplied to the SRAM, the flip-flop circuit 16 continuously retains one of the two stable states.

The operation of the memory cell shown in FIG. 1 will now be described. When neither writing operation nor reading operation is required to the memory cell; i.e., when the memory cell is in a standby state, both the access transistors A1 and A2 are held in an off state. In this case, the memory nodes N1 and N2 are continuously retained at either (High, Low) or (Low, High).

When reading out of data from the memory cell is required, the access transistors A1 and A2 become turned on, to thereby electrically connect the memory node N1 to the bit line BIT 10 and the memory node N2 to the bit line /BIT 12. The BIT 10 and /BIT 12 lines are controlled so as to become high at the time of reading data from the memory cell. Thus, the potential of one of the bit lines BIT 10 and /BIT 12 which is brought into contact with the memory mode N1 or N2 having a low level temporarily drops to a low level. In SRAM, a variation in the voltage of such a bit line is amplified by an unillustrated sense amplifier, to thereby read data from the memory cell.

At the time of writing data into the memory cell, the access transistors A1 and A2 are turned on, and the potential of either the bit line BIT 10 or /BIT 12 drops considerably. For example, when the potential of the bit line /BIT 12 drops, during the data writing operation, a high-level signal is supplied to the memory node N1, and a low-level signal is supplied to the memory node N2. In this case, the flip-flop circuit 16 comprising the loads L1 and L2 and the driver transistors D1 and D2 is brought into a stable state corresponding to the high-level and low-level signals, so that the memory nodes N1 and N2 are set to (High, Low).

From the viewpoint of stable operation of SRAM, the threshold value Vath for the operation of the access transistors A1 and A2 is desirably low. In contrast, the threshold value Vdth for the operation of the driver transistors D1 and D2 is desirably high. The reasons for this will now be described by reference to FIGS. 3 through 6.

Figure 3:
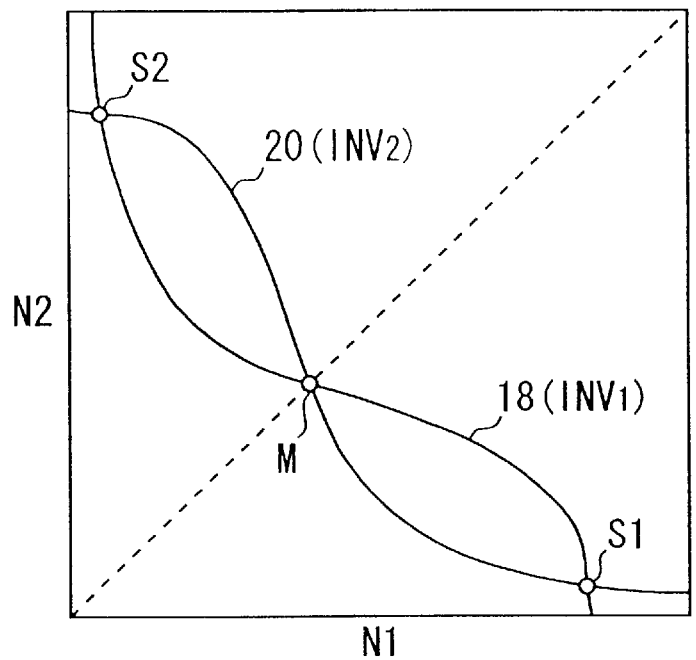
FIG. 3 shows a first example of an input/output transmission characteristics of the flip-flop circuit shown in FIG. 1.

FIG. 3 shows an input/output transmission characteristics of the inverter circuits INV1 and INV2 included in the flip-flop circuit 16. More specifically, a characteristic curve 18 shown in FIG. 3 represents the characteristic of the inverter circuit INV1 whose input voltage equals the potential of the memory node N2 and whose output voltage equals the potential of the memory node N1. A characteristic curve 20 represents the characteristic of the inverter circuit INV2 whose input voltage equals the potential of the memory node N1 and whose output voltage equals the potential of the memory node N2. The characteristic curve 18 of the inverter circuit INV1 and the characteristic curve 20 of the inverter circuit INV2 are changed in a manner to be described later according to the states of the loads L1 and L2 connected with the inverter circuits INV1 and INV2 or the like.

The flip-flop circuit 16 becomes stable at points of intersection between the characteristic curve 18 of the inverter circuit INV1 and the characteristic curve 20 of the inverter circuit INV2. In order to cause the inverter circuits INV1 and INV2 to stably operate as the flip-flop circuit 16, the areas encompassed by the characteristic curves 18 and 20 are preferably as large as possible. The diameter of a circle which can be depicted within the area encompassed by the characteristic curves 18 and 20 is used as an indicator representing the size of the encompassed area. The indicator will hereinafter be referred to as a static noise margin (SNM).

Figure 4:
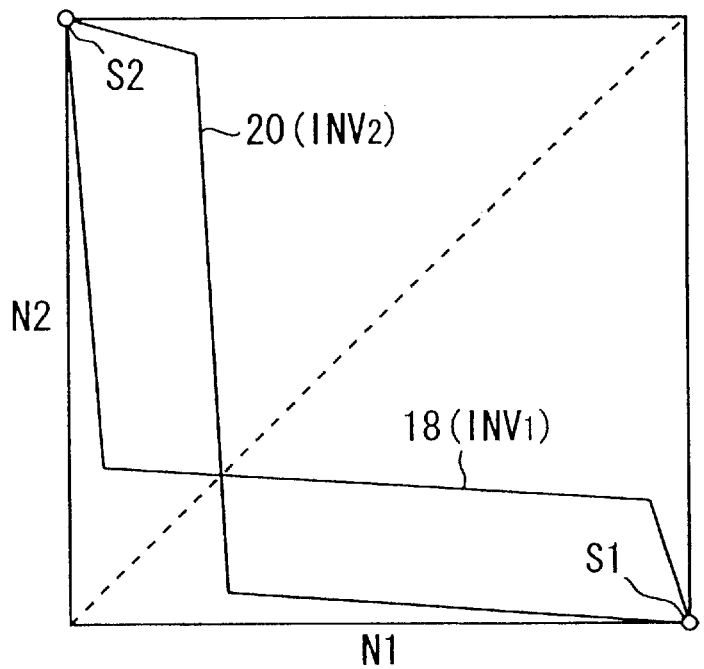
FIG. 4 shows a second example of the input/output transmission characteristics of the flip-flop circuit shown in FIG. 1.

FIG. 4 shows the characteristic curve 18 of the inverter circuit INV1 and the characteristic curve 20 of the inverter circuit INV2 when the memory cell is in a standby condition. When the memory cell is in a standby state, the access transistors A1 and A2 are controlled to be inactive, resulting in the state equivalent to a state in which only the loads L1 and L2 of sufficiently high impedance are connected to the driver transistors D1 and D2.

In this state, only slight changes arising in the electric current flowing through the driver transistors D1 and D2 generates significant changes in the potential of the memory nodes N1 and N2. As shown in FIG. 4, the characteristic curve 18 of the inverter circuit INV1 and the characteristic curve 20 of the inverter circuit INV2 show abrupt changes at the same time when a state transition arises, whereby a sufficiently large SNM can be ensured. Consequently, the memory cell in a standby condition can stably retain data.

Figure 5:
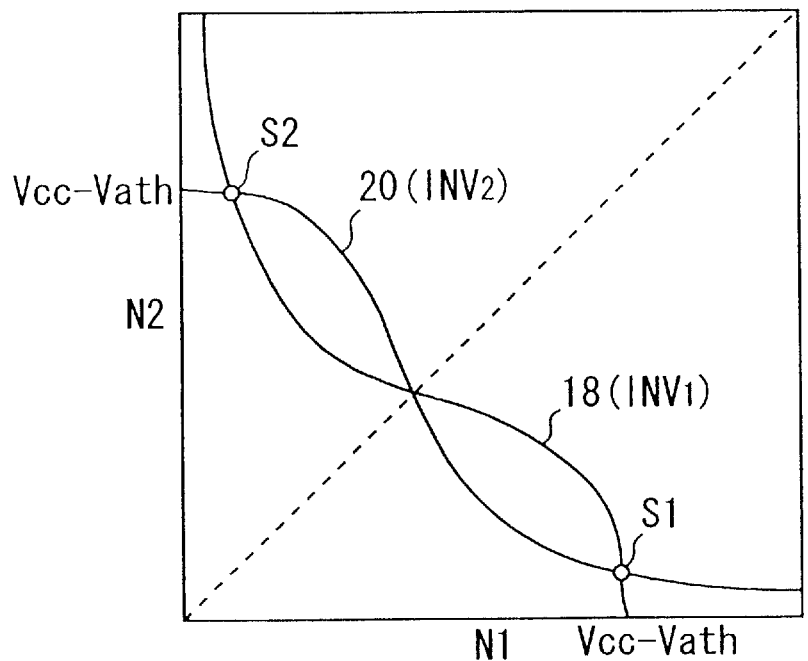
FIG. 5 shows a third example of the input/output transmission characteristics of the flip-flop circuit shown in FIG. 1.

FIG. 5 shows the characteristic curve 18 of the inverter circuit INV1 and the characteristic curve 20 of the inverter circuit INV2 appearing at the time of reading of data. When data are read from the memory cell, the access transistors A1 and A2 are turned on, and a column current (or cell current) from the bit line BIT 10 or /BIT 12 flows into the memory node N1 or N2 having a low level. In this case, there is achieved a state equivalent to that in which loads of low impedance are connected to the driver transistors D1 and D2 in parallel with the loads L1 and L2.

If loads of low impedance are connected to the driver transistors D1 and D2, change—which appear on the potential of the memory nodes N1 and N2 in association with changes in the electric currents flowing through the loads—become small. As shown in FIG. 5, the characteristic curve 18 of the inverter circuit INV1 and the characteristic curve 20 of the inverter circuit INV2 change less abruptly during a state transition than in the case when SRAM is in a standby condition.

Further, when the access transistors A1 and A2 are in an ON state, the potential of the memory node N1 or N2 of the high state becomes lower than the supply potential Vcc by the threshold value Vath for the operation of the access transistors A1 and A2. That is, the potential of the memory node N1 or N2 accords with Vcc-Vath (see FIG. 5). Therefore, an SNM obtained at the time of reading of data, at which the access transistors A1 and A2 are turned on, is smaller than the SNM obtained when SRAM is in a standby condition.

At the time at which the SNM assumes a small value as mentioned previously, the data stored in the memory cell are most vulnerable to corruption. Accordingly, in order to stably activate the memory cell, a sufficient SNM must be ensured when the access transistors A1 and A2 are turned on in association with writing of data.

The SNM obtained when the access transistors A1 and A2 are turned on in association with writing of data (hereinafter referred to as a "writing SNM") can be improved by reducing the threshold value Vath for the operation of the access transistors A1 and A2 to thereby sufficiently increase the potential (Vcc-Vath) of the memory node N1 or N2 of a high state. Further, the writing SNM can be improved by rendering the gate width of the driver transistors D1 and D2 larger than that of the access transistors A1 and A2, to thereby increase a β ratio; i.e., a conductance ratio between the driver transistors D1 and D2 and the access transistors A1 and A2.

Since the area occupied by an individual memory cell is diminished in association with integration of SRAM, increasing the gate width of the driver transistors D1 and D2 is difficult. In other words, effecting the previously-described later method for improving the writing SNM becomes difficult. For these reasons, the threshold value Vath for the operation of the access transistors A1 and A2 is an important factor for ensuring sufficient writing SNM.

Figure 6:
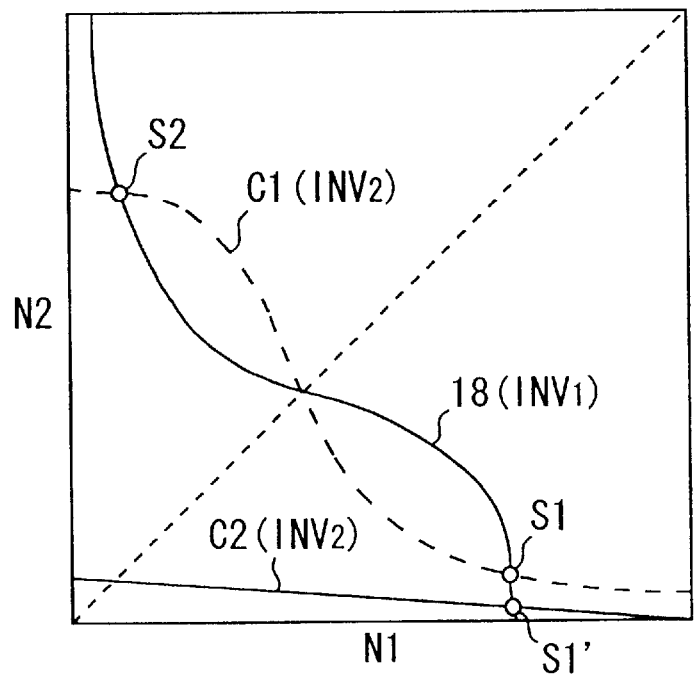
FIG. 6 shows a fourth example of the input/output transmission characteristics of the flip-flop circuit shown in FIG. 1.

FIG. 6 shows the input and output transmission characteristics of the inverter circuits INV1 and INV2 at the time of writing of data into the memory cell. Specifically, FIG. 6 shows the input and output transmission characteristics of the inverter circuits INV1 and INV2 which will be implemented when the memory nodes N1 and N2 are brought into a stable state (N1=high, N2=low). As mentioned previously, data are written into the memory cell while the access transistors A1 and A2 are in an ON state and the potential of the bit line BIT 10 or /BIT 12 is pulled down.

A curve C1 shown in FIG. 6 designates a characteristic curve of the inverter circuit INV2 after the access transistors A1 and A2 have been turned on. If the potential of the bit line /BIT 12 is pulled down when the access transistor A2 is in an ON state, the potential of the memory node N2 is forcefully dropped to a voltage in the vicinity of the ground potential. In this case, the output voltage of the inverter circuit INV2 (i.e., the potential of the memory node N2) is maintained at a voltage in the vicinity of the ground potential hereunder regardless of the input voltage of the inverter circuit INV2 (i.e., the potential of the memory node N1). Accordingly, the input and output characteristic of the inverter circuit INV2 corresponds to a characteristic C2 shown in FIG. 6.

In a case where the characteristic of the inverter circuit INV2 is represented by the characteristic curve C2, the flip-flop circuit 16 becomes stable at only a point corresponding to S1' shown in FIG. 6. Therefore, if the bit line /BIT 12 is pulled down as mentioned previously, data are written into the memory cell so that the memory node N1 becomes high and the memory node N2 becomes low.

Immediately after data have been written into the memory cell in the manner as mentioned above, the potential of the memory node N1 set in a high state is brought into the value which can be obtained by subtracting the threshold value Vath for the operation of the access transistors A1 and A2 from the supply potential Vcc. That is, the potential of the memory node N1 becomes so as to corresponds to Vcc−Vath (see FIG. 6). The smaller the value (Vcc−Vath), the more easily the data written in the memory cell are corrupted by the influence of external noise or a software error caused by α-rays.

It is to be noted that a software error caused by α-rays corresponds to a phenomenon in which data are corrupted as a result of α-rays falling on the memory node N1 or N2 set to a high state(hereinafter referred to as a "high-level nodes") within the memory cell. The phenomenon arises on the basis of the following principle. When α-rays fall on the high-level node of the memory cell, electron-hole pairs arise along the path through which a-rays enter. Electrons which have arisen in a depletion layer are attracted to the high-level node, as a result of which the potential of the high-level node is decreased, to thereby invert the flip-flop circuit 16 and corrupt the data stored in the memory cell.

The lower the supply voltage Vcc, the greater the influence exerted on the potential (Vcc–Vath) of the high-level node by the threshold value Vath for the operation of the access transistors A1 and A2. There has recently arisen demand for a drop in the supply voltage Vcc according to demand for power-saving SRAM. For this reason, the threshold value Vath for the operation of the access transistors A1 and A2 assuming a lower value is an important factor for protecting data from corruption.

As mentioned above, the threshold value Vath for the operation of the access transistors A1 and A2 desirably assumes a low value in consideration of stable operation of SRAM at the time of reading of data, as well as stable operation of SRAM at the time of writing of data.

There will now be described a reason why the threshold value Vdth for the operation of the driver transistors D1 and D2 assuming a higher value is desirable for stable operation of SRAM. As mentioned above, when SRAM is in a standby condition, there is implemented a state equivalent to the state in which only the loads L1 and L2 are connected to the driver transistors D1 and D2.

In this case, in order to maintain the potential of the high-level node (the memory node N1 or N2) in a high state, off-leakage currents; i.e., sub-threshold leakage currents of the driver transistors D1 and D2 must be weaker than the electric current flowing through the load elements L1 and L2. More specifically, in order to maintain the potential of the memory node N1 at a high state, the off-leakage current of the driver transistor D1 must be weaker than the electric current flowing through the load element L1. Likewise, in order to maintain the potential of the memory node N2 in a high state, the off-leakage current of the driver transistor D2 must be weaker than the electric current flowing through the load element L2.

The off-leakage currents of the driver transistors DI and D2 become weaker as the threshold value Vdth for the operation of the driver transistors D1 and D2 become greater. Thus, the threshold value Vdth for the operation of the driver transistors D1 and D2 assuming a large value is effective for stably activating SRAM.

As mentioned above, stable operation of SRAM whose individual memory cells have the electrical structure shown in FIG. 1 requires setting of the threshold value Vath for the operation of the access transistors A1 and A2 to a low value, as well as setting of the threshold value Vdth for the operation of the driver transistors D1 and D2 to a high value. In other words, configuring SRAM which operates stable requires fabrication, on a single substrate, of access transistors whose operation threshold value is low and driver transistors whose operation threshold value is high.

A plurality of types of transistors which operate at different threshold values can be fabricated on a single substrate by locally changing the concentration of impurities to be implanted into the substrate. Such a method, however, requires a process for changing the concentration of impurities to be implanted, which in turn complicates the overall manufacturing process. SRAM according to the present embodiment has a structure suitable for fabricating, on a single substrate, a plurality of types of transistors which operate at different threshold values, through a simple manufacturing step. The structure and characteristics of SRAM according to the present embodiment and a method of manufacturing the SRAM will now be described by reference to FIGS. 7 through 16.

Figure 7:
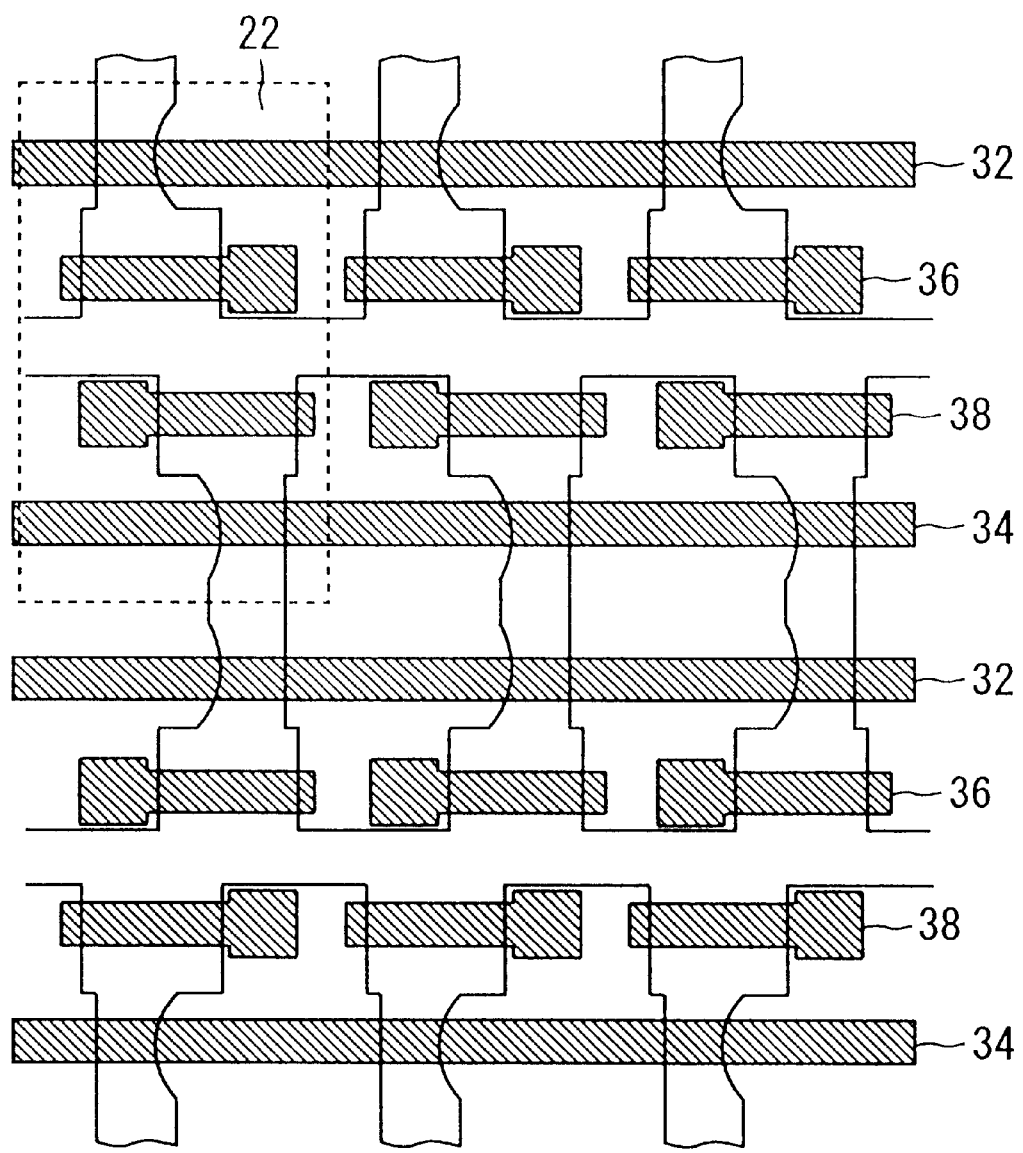
FIG. 7 is a plan view showing a state of an SRAM according to the first embodiment in one manufacturing process.

FIG. 7 is a plan view showing the state of SRAM according to the present embodiment in one manufacturing process. FIG. 7 shows the area of SRAM where six (3×2) memory cells are fabricated. The area surrounded by a broken line shown in FIG. 7 corresponds to a single memory cell 22.

Figure 8B:
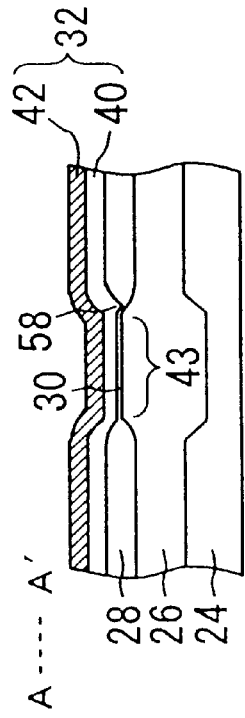
FIG. 8B is a cross-sectional view of the SRAM according to the first embodiment taken along line A–A' shown in FIG. 8A.
Figure 8C:
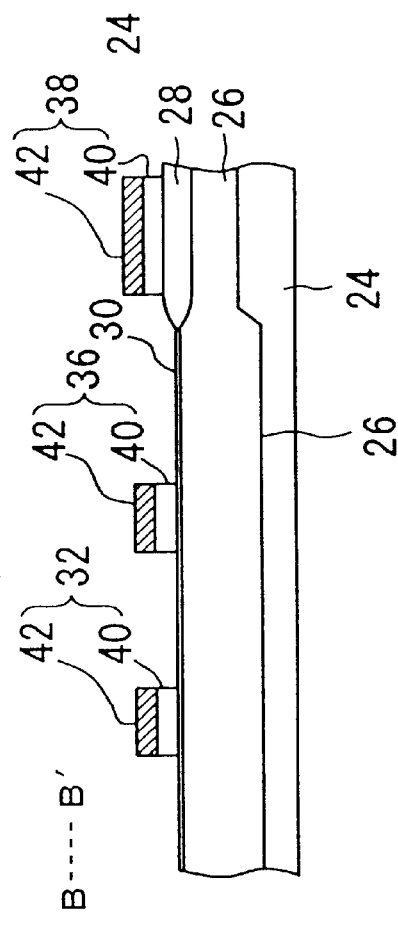
FIG. 8C is a cross-sectional view of the SRAM according to the first embodiment taken along line B–B' shown in FIG. 8A.
Figure 8A:
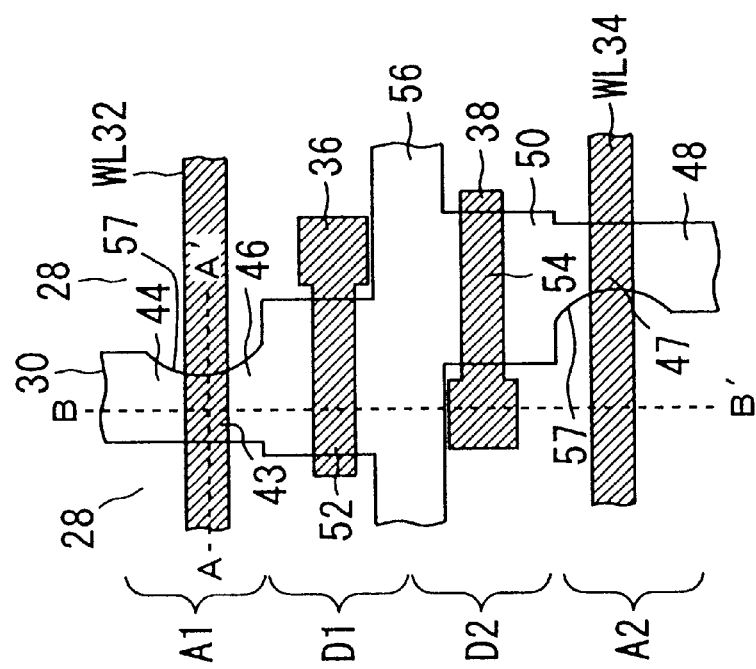
FIG. 8A is an enlarged plan view showing a memory cell of the SRAM according to the first embodiment.

FIG. 8A is an enlarged plan view showing the memory cell 22 of SRAM shown in FIG. 7; FIG. 8B is a cross-sectional view of SRAM according to the present embodiment taken along line A–A' shown in FIG. 8A; and FIG. 8C is a cross-sectional view of SRAM taken along line B–B' shown in FIG. 8A.

As shown in FIG. 8B and 8C, the SRAM according to the present embodiment comprises an n-type silicon substrate 24 containing n-type impurities such as P or As at high concentration. A p-type well region 26 containing p-type impurities such as B at low concentration is formed on the silicon substrate 24. A field-oxide film 28 is formed in the vicinity of the surface of the well region 26 for separating from one another active regions of a plurality of transistors.

As shown in FIG. 8A, for the area corresponding to a single memory cell 22, there are ensured active regions where two access transistors A1 and A2 are to be fabricated and another active regions where two driver transistors D1 and D2 are to be fabricated. In the state shown in FIGS. 8A through 8C, an active region of the silicon substrate 24; i.e., an area which is not covered by the field-oxide film 28, is covered with the silicon oxide film 30.

Two word lines 32 and 34 and two gate electrodes 36 and 38 are formed on a silicon oxide film 30 so as to correspond to a single memory cell 22 and extend in parallel with one another. In the present embodiment, each of the word lines 32 and 34 and the gate electrodes 36 and 38 comprises a multilayer structure including a P-doped polysilicon film 40 and a metal silicide film 42.

The word line 32 is a constituent element also acts as a gate electrode of the access transistor A1 and is formed so as to cross the active region where the access transistor A1 is to be fabricated. Similarly, the word line 34 is formed so as to cross the active region where the access transistor A2 is to be fabricated. The gate electrode 36 is formed so as to cross the active region where the driver transistor D1 is to be fabricated, and the gate electrode 38 is formed so as to cross the active region where the driver transistor D2 is to be fabricated.

As a result, an active region 43 which is to act as a channel region of the access transistor A1 is formed immediately below the word line 32. An active region 44 which is to act as a source/drain region of the access transistor A1 is formed on one side of the word line 32, and an active region 46 which is to serve as both a source/drain region of the access transistor A1 and a source/drain region of the driver transistor D1 is formed on the other side of the word line 32. Further, an active region 47 which is to act as a channel region of the access transistor A2 is formed immediately below the word line 34. An active region 48 which is to act as a source/drain region of the access transistor A2 is formed on one side of the word line 34, and an active region 50 which is to serve as both a source/drain region of the access transistor A2 and a source/drain region of the driver transistor D2 is formed on the other side of the word line 34.

Moreover, an active region 52 which is to act as a channel region of the driver transistor D1 is formed immediately below the gate electrode 36, and an active region 54 which is to act as a channel region of the driver transistor D2 is formed immediately below the gate electrode 38. An active region 56 which is to double as the source/drain regions of the two driver transistors D1 and D2 is formed between the gate electrodes 36 and 38.

In the present embodiment, as shown in FIG. 8A, the field-oxide film 28 is formed so as to protrude toward the active region 43 where the access transistor A1 is to be fabricated, as well as toward the active region 47 where the access transistor A2 is to be fabricated, when viewed from above. More specifically, the field-oxide film 28 is formed so as to assume a smooth circular-arch protruding geometry such that the minimum width of the active regions 43 and 47 (the minimum width in the transverse direction in FIG. 8A) becomes smaller than the minimum width of the active regions 44 and 46 or the minimum width of the active regions 48 and 50. The protruding portion of the field-oxide film 28 will hereinafter be referred to as a "protuberance 57."

Further, the field-oxide film 28 is formed such that the transverse width of the active regions 52 and 54 which are to act as the channel regions of the driver transistors D1 and D2 are wider than the width of the active regions 43 and 47 which are to act as the channel regions of the access transistors A1 and A2.

The cross-sectional view shown in FIG. 8B represents a boundary between the protuberance 57 of the field-oxide film 28 and the active region 43 which is to act as the channel region of the access transistor A1. As shown in FIG. 8B, trenches 58 are formed along the boundary. The SRAM according to the present embodiment is characterized in that the trenches 58 are formed along the boundary in the field-oxide film 28, and that the trenches 58 are formed through a simple process.

Figure 9A:
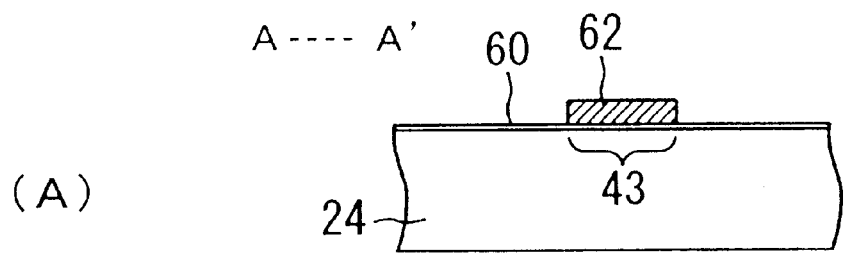
Figure 9B:
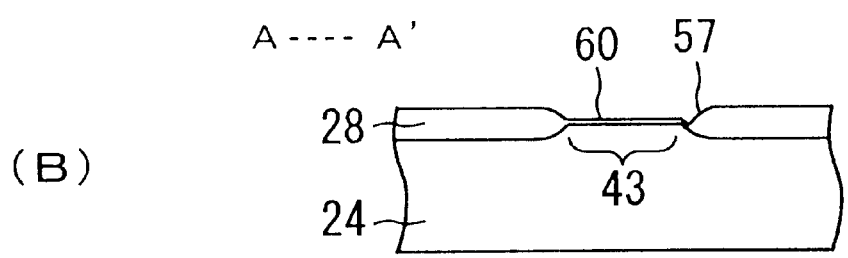
Figure 9C:
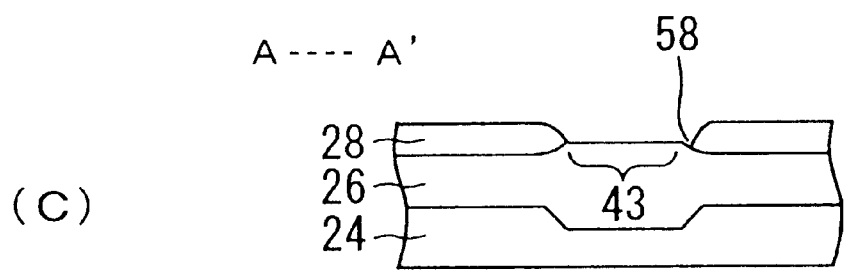

Hereinafter, processes during which the field-oxide film 28 and the trenches 58 are formed on the silicon substrate 24 will now be described with reference to FIGS. 9A to 9C. FIGS. 9A through 9C are cross-sectional views of SRAM taken along line A–A' which correspond to FIG. 8B.

Under the manufacturing method according to the present embodiment, a pad film 60 is formed from silicon dioxide ($SiO_2$), over the entire surface of the n-type silicon substrate 26. Next, an oxidation-resistance mask 62 is formed from silicon nitride ($Si_3N_4$) on the pad film 60 (see FIG. 9A). The oxidation-resistance mask 62 is formed so as to become geometrically identical with the active regions 43 and 47 shown in FIG. 8A; i.e., the oxidation-resistance mask 62 is formed so as to assume a circular-arch smoothly-concavity geometry and cover the active regions 43 and 47.

After formation of the oxidation-resistance mask 62, the semiconductor substrate is subjected to thermal oxidation by means of the local oxidation of silicon (LOCOS) method. Consequently, the field-oxide film 28 is selectively formed in the area where is not covered with the oxidation-resistance mask 62 to a thickness of about 3,000 angstroms. After formation of the field-oxide film 28, the oxidation-resistance mask 62 is removed through use of phosphoric acid (FIG. 9B).

During the course of the oxidation by means of LOCOS technique, the edge of the field-oxide film 28 laterally grows under the oxidation-resistance mask 62, thus resulting in formation of a bird's beak. The bird's beak is likely to grow greatly if the field-oxide film 28 has a flat or concave end face in the plan view thereof. In contrast, the bird's beak encounters difficulty in growing if the field-oxide film 28 has a protruding end face in the plan view thereof. For this reason, as shown in FIG. 9B, the bird's beak arising in the protuberance 57 of the field-oxide film 28 (i.e., an area adjacent to the active region 43) is smaller than that formed in another area.

After removal of the oxidation-resistance mask 62, the pad film 60 covering the active region of the silicon substrate 24 is removed through use of hydrofluoric acid. As shown in FIG. 9C, trenches 58 are formed to a thickness of about 0.02 to 0.05 µm along the boundary between the active region 43 and the field-oxide film 28. As mentioned above, according to the manufacturing method of the present embodiment, the trenches 58 can be readily formed without involvement of any special processing other than forming the concave portion at a certain part of the oxidation-resistance mask 62.

After completion of the above-described processing, p-type impurities, such as B ions, are implanted into the entire surface of the silicon substrate 24 at a dose of $1.0 \times 10^{12}$ to $1.0 \times 10^{13}$ ions/cm$^2$ and an energy of 200 to 700 keV. Next, P-type impurities, such as B ions, are implanted again into the silicon substrate 24 at a dose of $3.0 \times 10^{12}$ and an energy of 30 to 70 keV. Through these processing steps, there is formed the p-type well region 26 containing impurities at a concentration of $1.0 \times 10^6$ to $1.0 \times 10^{18}$ ions/cm$^2$ or thereabout.

By means of thermal oxidation, a silicon oxide film 30 is formed to a thickness of about 40 to 100 angstroms, over the entire surface of the silicon substrate 24 in which the p-type well region 26 is formed.

Subsequently, the semiconductor substrate is subjected to deposition process employing a mixture gas including phosphine ($PH_3$) gas or like gas, by means of the low-pressure chemical vapor deposition (LPCVD) technique. Thus a doped polysilicon film 40 is formed so as to contain impurities at a concentration of 1.0 to $8.0 \times 10^{20}$ ions/cm$^2$ or thereabouts. A metal silicide layer 42, such as a tungsten silicide film, is formed on the doped polysilicon film 40.

On the metal silicide film 42, a photoresist is patterned into a predetermined geometry by means of photolithography. The metal silicide film 42 and the doped polysilicon film 40 is subjected to a reactive ion etching (RIE) using the photoresist as a mask, whereby the word lines 32 and 34 as well as the gate electrodes 36 and 38 are formed on the substrate 24. After performance of the series of the processing steps, the state shown in 8A to 8C is implemented. Although in the present embodiment the word lines 32 and 34 and the gate electrodes 36 and 38 are formed into a multilayer structure comprising polysilicon and metal silicide; i.e., a polycide structure, they may be formed into a single layer structure of polysilicon.

Primary processes for completing SRAM according to the first embodiment will now be described by reference to FIGS. 10 through 14.

FIG. 10 is a cross-sectional view taken along line B–B', showing the state of SRAM during the course of fabrication according to the present embodiment. After formation of the word lines 32 and 34 and the gate electrodes 36 and 38, n-type impurities, such as As ions, are implanted into the entire surface of the silicon oxide film 30 from above. At this time, the n-type impurities are implanted into the silicon substrate 24 at a dose of 1.0 to $5.0 \times 10^{13}$ ions/cm$^2$ or thereabout, at an energy of 30 to 70 keV, and at an angle of 45°, while the silicon substrate 24 is rotated. Consequently, in the active region of the silicon substrate 24 excluding the area thereof covered with the word lines 32 and 34 and the gate electrodes 36 and 38, there is produced an n-type lightly-doped drain region (LDD) 64 containing n-type impurities at a concentration of $1.0 \times 10^{17}$ to $1.0 \times 10^{19}$ ions/cm$^3$ or thereabouts.

By means of the LPCVD technique, a silicon oxide film is deposited on the entire surface of the silicon substrate 24 to a thickness of about 500 to 1500 angstroms. The silicon oxide film is etched by means of the RIE technique, so that a sidewall oxide film 66 is formed so as to cover the side surfaces of the word lines 32 and 34 and those of the gate electrodes 36 and 38. The silicon oxide film 30 covering the active region is removed except for the portions covered with the word lines 32 and 34 or the gate electrodes 36 and 38 during the course of RIE. Consequently, the silicon oxide film 30 functioning as a gate insulating film remains only beneath the word lines 32 and 34 as well as the gate electrodes 36 and 38.

N-type impurities, such as As ions, are implanted into the entire surface of the silicon substrate 24 at a dose of 1.0 to $5.0 \times 10^{15}$ ions/cm$^2$ or thereabouts and an energy of 30 to 70 keV. Consequently, in the area of the semiconductor substrate 24 exclusive of the areas covered with the word lines 32 and 34, the gate electrodes 36 and 38, and the sidewall oxide film 66, an n$^+$-type source/drain region 68 containing impurities at a concentration of $10 \times 10^{20}$ to $10 \times 10^{21}$ ions/cm$^3$ or thereabouts is formed on the surface of the semiconductor substrate to a depth of 0.05 to 0.15 $\mu$m or thereabouts. The source/drain region 68 and the LDD region 64 constitute active regions of LDD structure (i.e., the active regions 44, 46, 48, 50, and 56 shown in FIG. 8A) which act as the source/drain regions of the access transistors A1 and A2 and those of the driver transistors D1 and D2. As a result of the semiconductor substrate being subjected to the above-described series of processing steps, SRAM such as that shown in FIG. 10 is fabricated.

Figure 11A:
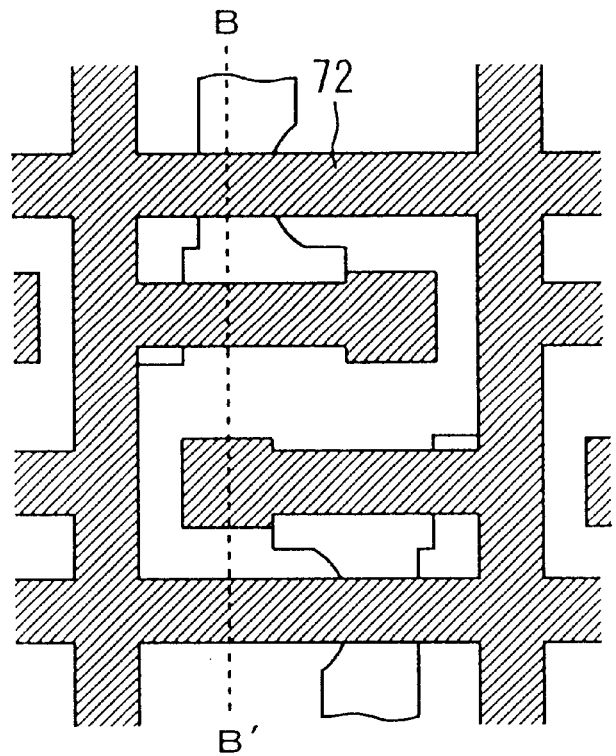
Figure 11B:
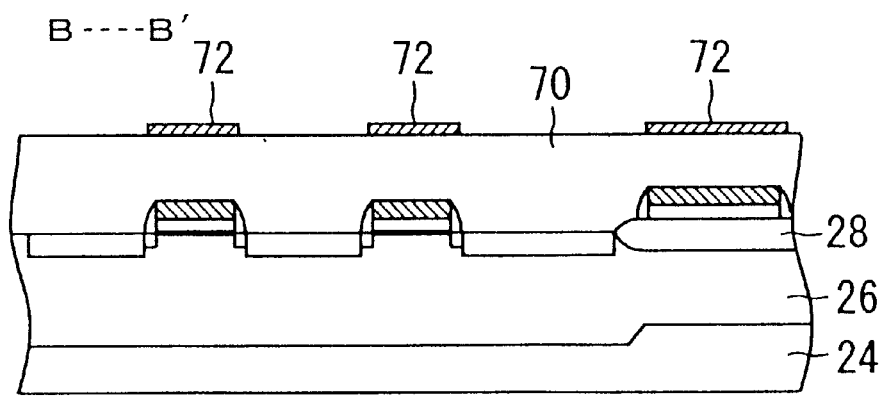

FIG. 11A is a plan view showing the state of SRAM in a processing step subsequent to that shown in FIG. 10 in the course of the manufacturing process according the present embodiment. FIG. 11B is a cross-sectional view of the SRAM taken along line B–B' shown in FIG. 11A. As shown in FIG. 11B, a silicon oxide film 70 is deposited on the entire surface of the silicon substrate 24 to a thickness of 2,000 to 10,000 angstroms.

By means of the LPCVD technique, polysilicon is deposited on the silicon oxide film 70 to a thickness of about 200 to 1,000 angstroms. N-type impurities, such as P ions, are implanted into the polysilicon film at a dose of about $1.0 \times 10^{12}$ to $1.0 \times 10^{14}$ ions/cm$^2$ and an energy of 30 keV. Subsequently, the doped polysilicon film is patterned to a predetermined shape by means of photolithography and RIE, thus forming a wiring layer 72.

Figure 12A:
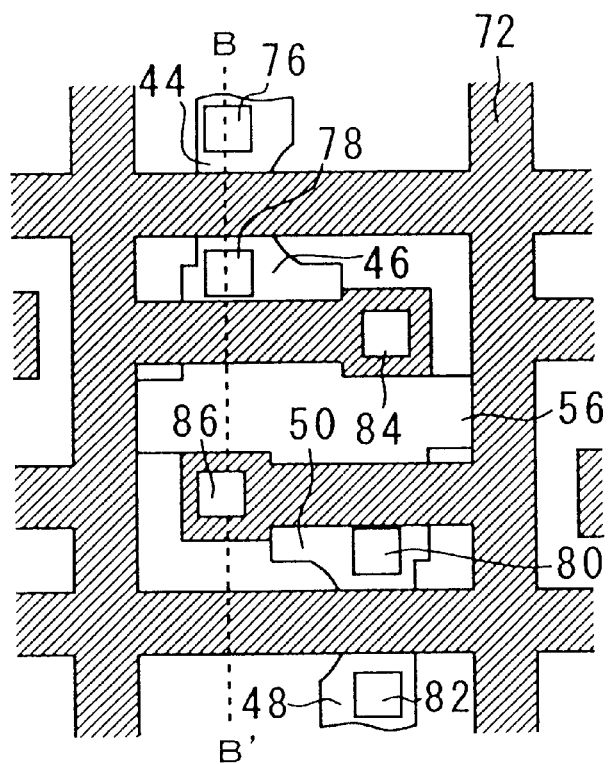
Figure 12B:
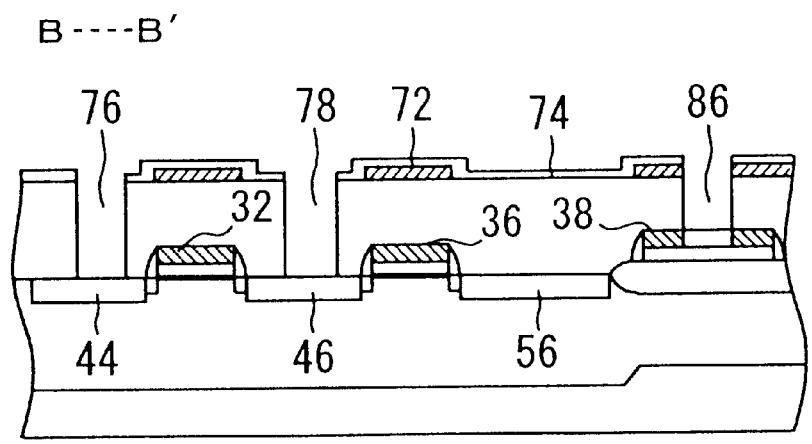

FIG. 12A is a plan view showing the state of SRAM in a processing step subsequent to that shown in FIG. 11A in the course of the manufacturing process according the present embodiment. FIG. 12B is a cross-sectional view of SRAM taken along line B–B' shown in FIG. 12A. As shown in FIG. 12B, by means of the LPCVD technique, a silicon oxide film 74 is deposited on the wiring layer 72 to a thickness of 100 to 300 angstroms.

Contact holes 76 to 86 are formed in the semiconductor substrate by means of photolithography and etching. The contact hole 76 is opened in the active region 44 which is to act as the source/drain region of the access transistor A1, and the contact hole 82 is opened in the active region 48 which is to act as the source/drain region of the access transistor A2. The contact hole 78 is opened in the active region 46 which doubles as the source/drain region of the access transistor A1 and the source/drain region of the driver transistor D1, and the contact hole 80 is opened in the active region 50 which doubles as the source/drain region of the access transistor A2 and the source/drain region of the driver transistor D2. The contact hole 84 is opened so as to communicate with the gate electrode 36 (see FIG. 8A) of the driver transistor D1 by penetrating through a portion of the wiring layer 72, and the contact hole 86 is opened so as to communicate with the gate electrode 38 (see FIG. 8B) of the driver transistor D2 by penetrating through a portion of the wiring layer 72.

Figure 13A:
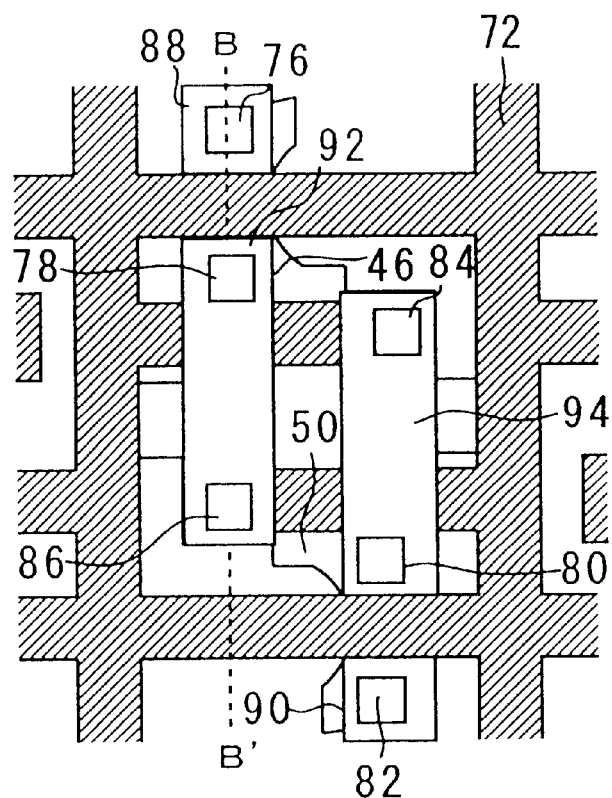
Figure 13B:
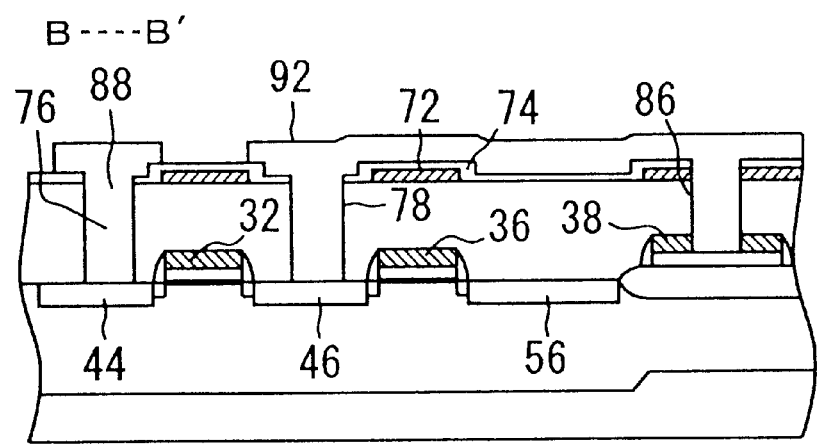

FIG. 13A is a plan view showing the state of SRAM in a processing step subsequent to that shown in FIG. 12A in the course of the manufacturing process according the present embodiment. FIG. 13B is a cross-sectional view of SRAM taken along line B–B' shown in FIG. 13A. After formation of the contact holes 76 to 86, a doped polysilicon film containing phosphorous ions at a concentration of about $1.0 \times 10^{20}$ to $8.0 \times 10^{20}$ ions/cm$^3$ is deposited to a thickness of 1,000 to 2,000 angstroms, by means of the LPCVD technique.

Contact plugs 88 and 90 and wiring patterns 92 and 94 are formed by patterning the doped polysilicon film into a predetermined geometry by means of photolithography and etching. The contact plug 88 is electrically connected, by way of the contact hole 76, to the active region 44 which is to act as the source/drain region of the access transistor A1, and the contact plug 90 is electrically connected, by way of the contact hole 78, to the active region 48 which is to act as the source/drain region of the access transistor A2.

By utilization of the contact holes 78 and 86, the wiring pattern 92 electrically connects the gate electrode 38 of the driver transistor D2 to the active region 46 that doubles as the source/drain region of the access transistor A1 and the source/drain region of the driver transistor D1. Further, by utilization of the contact holes 80 and 84, the wiring pattern 94 electrically connects the gate electrode 36 of the driver transistor D1 to the active region 50 which doubles as the source/drain region of the access transistor A2 and the source/drain region of the driver transistor D2.

In the SRAM having the configuration shown in FIGS. 13A and 13B, a thin-film transistor (TFT) which serves as the load element L1 to be electrically connected to the driver transistor D1 is constituted by a portion of the wiring layer 72 which overlaps with the gate electrode 38 of the driver transistor D2, the wiring pattern 94, and a portion of the silicon oxide film 74 which is located between those two elements. In this configuration, the wiring pattern 94 serves as a gate electrode; the portion of the silicon oxide film 74 covered with the wiring pattern 94 serves as a gate oxide film; and the portion of the wiring layer 72 located immediately below the wiring pattern 94 acts as a channel region.

Similarly, in the SRAM having the configuration shown in FIGS. 13A and 13B, a TFT which serves as the load element L2 to be electrically connected to the driver transistor D2 is constituted by a portion of the wiring layer 72 which overlaps with the gate electrode 36 of the driver transistor D1, the wiring pattern 94, and a portion of the silicon oxide film 74 which is located between those two elements. In this configuration, the wiring pattern 92 serves as a gate electrode; the portion of the silicon oxide film 74 covered with the wiring pattern 92 serves as a gate oxide film; and the portion of the wiring layer 72 located immediately below the wiring pattern 92 acts as a channel region.

Figure 14A:
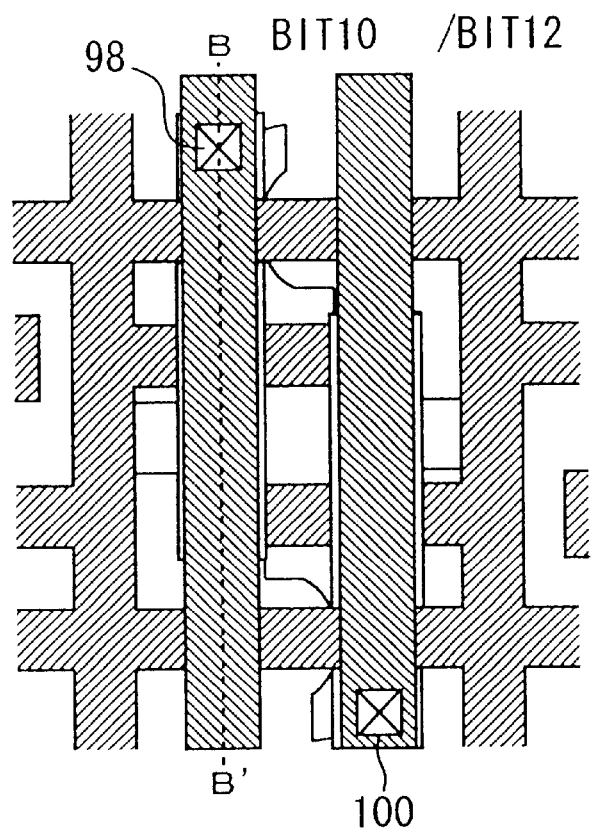
Figure 14B:
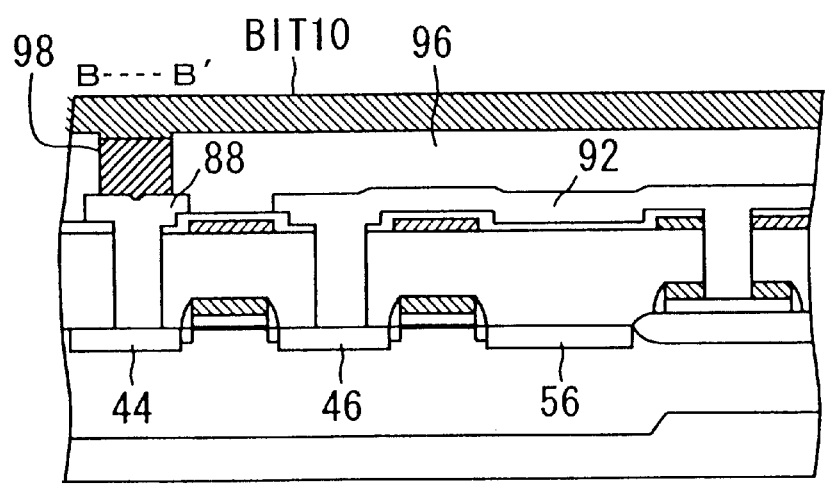

FIG. 14A is a plan view showing the state of SRAM in a processing step subsequent to that shown in FIG. 13A in the course of the manufacturing process according the present embodiment. FIG. 14B is a cross-sectional view of SRAM taken along line B–B' shown in FIG. 14A. As shown FIG. 14B, an interlayer film 96 is formed on the wiring pattern 92 and the contact plug 88. As shown in FIG. 14A, a contact hole 98 to be connected to the contact plug 88 and a contact hole 100 to be connected to the contact plug 90 are formed in the interlayer film 96.

The bit lines BIT 10 and /BIT 12 are formed from an aluminum wiring pattern on the interlayer film 96. The bit line BIT 10 is electrically connected, by way of the contact hole 98, to the contact plug 88 that communicates with the source/drain region (active region 44) of the access transistor A1. The bit line /BIT 12 is electrically connected to the contact plug 90 that communicates with the source/drain region (active region 48) of the access transistor A2. As a result of formation of the bit lines BIT 10 and /BIT 12 in the manner as mentioned previously, the electrical configuration of the SRAM shown in FIG. 1 is embodied.

Figure 15:
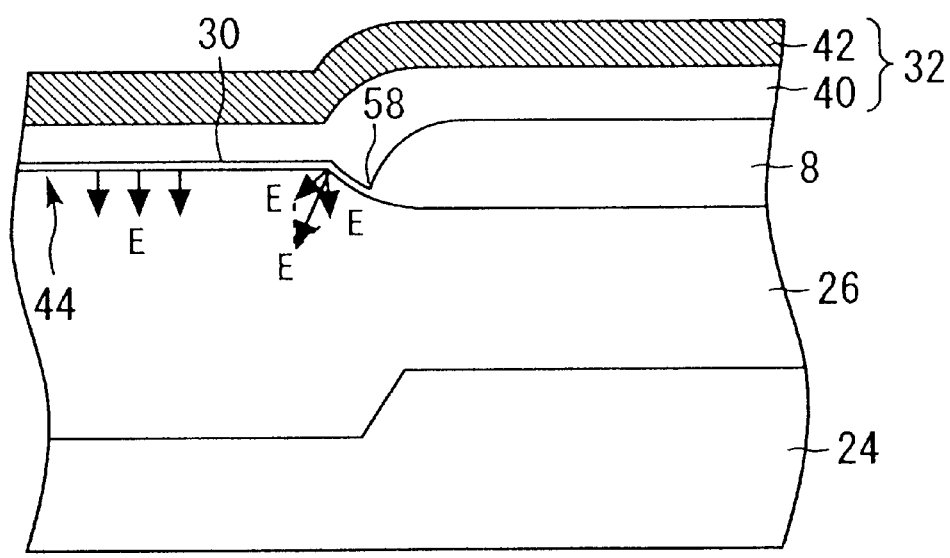
FIG. 15 is a cross-sectional view for describing an operation of the SRAM according to the first embodiment.

FIG. 15 is an enlarged view showing the trench 58 shown in FIG. 8B. As mentioned above, the SRAM of the present embodiment comprises the trench 58 formed in the boundary region between the active region 44, which is to act as the channel region of the access transistor A1, and the field-oxide film 28. The threshold value for the operation of the access transistor A1 is reduced as the channel width is reduced, by means of the reverse narrow channel effect caused by the trench 58.

The principle on which the reverse narrow channel effect is caused by the trench 58 will now be described. When a voltage is applied to the gate electrode 32, gate electric field E develops in the channel region (active region 44) of the access transistor A1. The gate electric field E comprising only vertical components develops in the area of the active region 44 distant from the trench 58. In contrast, in the area of the active region 44 close to the trench 58, the gate electric field E develops such that both vertical and horizontal components are included. Therefore, the gate electric field E acting on the area of the active region 44 close to the trench 58 is stronger than the gate electric field E acting on the area of the active region 44 distant from the trench 58. Thus, an inversion layer is formed more readily in the area of the active region 44 close to the trench 58 than in the area of the active region 44 distant from the trench 58.

The threshold value Vath for the operation of the access transistor A1 becomes smaller as formation of the inversion layer in the active region 44 becomes easier. The characteristic of the area of the active region 44 close to the trench 58 greatly affects the overall characteristic of SRAM as the width of the active region 44 (i.e., the width of the active region 44 in the transverse direction shown in FIG. 8A) becomes narrower. For this reason, the inversion layer is more easily formed as the width of the active region 44 becomes narrower, thereby reducing the threshold value Vath for the operation of the access transistor A1.

Figure 16:
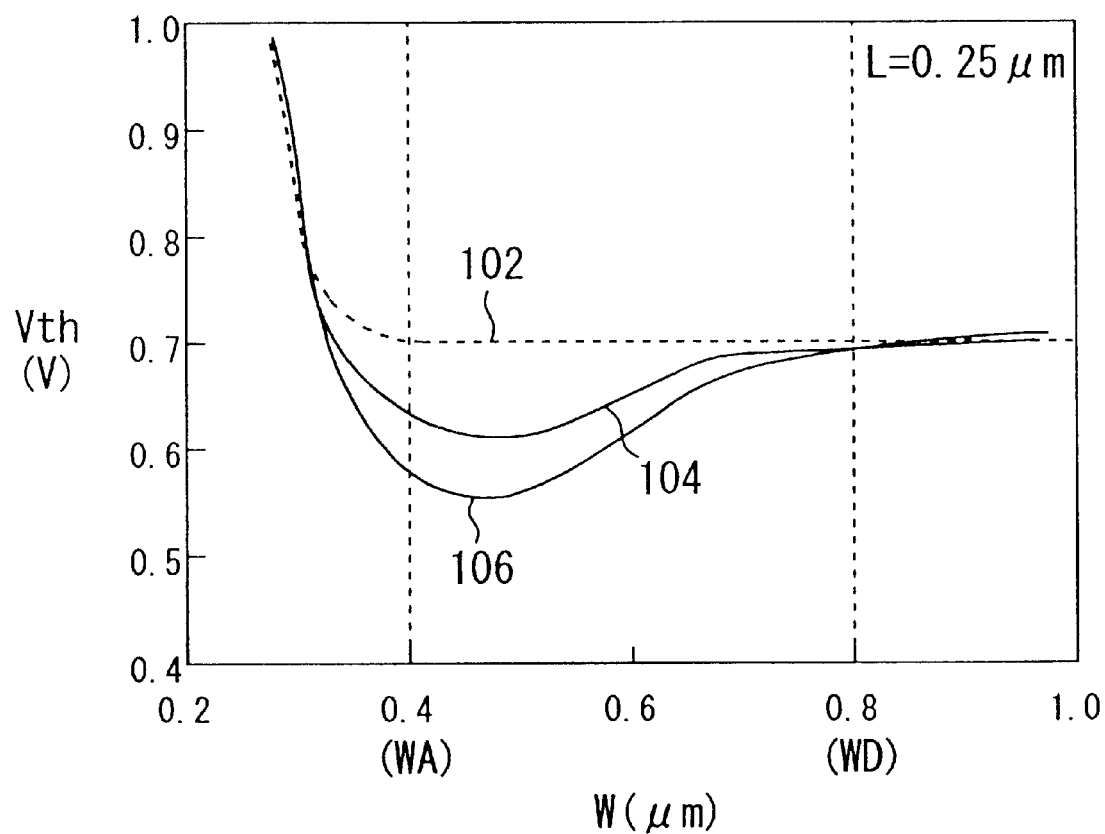
FIG. 16 is a graph showing characteristics of SRAMs according to the first embodiment or a second embodiment of the present invention.

FIG. 16 shows a relationship between the threshold value Vth for operation of a transistor and the channel width W when the channel length L of the transistor (corresponding to the width of the word line) is set to a value of 0.25 $\mu$m. In FIG. 16, a characteristic curve 102 designates the characteristic of the transistor when the trench 58 is not formed at the edge of the channel region; and a characteristic curve 104 designates the characteristic of the transistor when the trench 58 is formed at the edge of the channel region. As designated by the characteristic curve 104, in a case where the trench 58 is formed at the edge of the channel region, the threshold value Vth tends to decrease as the channel width W becomes smaller than a value of 0.8 $\mu$m. The tendency becomes very noticeable when the channel width W becomes smaller than a value of 0.6 $\mu$m.

In the SRAM of the present embodiment, both the channel length L of the driver transistors D1 and D2 and the channel length L of the access transistors A1 and A2 are set to a value of 0.25 $\mu$m. Accordingly, the driver transistors D1 and D2 exhibit the characteristic depicted by the characteristic curve 102, and the access transistors A1 and A2 exhibit the characteristic depicted by the characteristic curve 104.

In the present embodiment, the channel width WA of the access transistors A1 and A2 is set to a value of 0.4 $\mu$m. Meanwhile, the channel width WD of the driver transistors D1 and D2 is set to a value of 0.8 $\mu$m. The threshold value Vdth for operation of the driver transistors D1 and D2 assumes a value of 0.70 V, and the threshold value Vath for operation of the access transistors A1 and A2 assumes a value of 0.63V.

As mentioned above, in the SRAM of the present embodiment, there are fabricated on a single substrate the access transistors A1 and A2 whose threshold value Vath for operation assumes a low value as well as the driver transistors D1 and D2 whose threshold value Vdth for operation assumes a high value. For this reason, the SRAM of the present embodiment can achieve a stable operating characteristic even in any of the following situations; that is, a situation in which the SRAM is in a standby condition, a situation in which data are written into the SRAM, and a situation in which data are read from the SRAM.

In the SRAM of the present embodiment, the trench 58 is formed at the edges of the channel regions of the access transistors A1 and A2, and the threshold value Vath for operation of the access transistors A1 and A2 is reduced to a small value. The SRAM of the present embodiment can be manufactured through simple manufacturing processes without involvement of making the concentration at which impurities are to be implanted into the area where the access transistors A1 and A2 are to be fabricated different from the concentration at which impurities are to be implanted into the area where the driver transistors D1 and D2 are to be fabricated.

In the SRAM of the present embodiment, the trench 58 can be formed by forming solely the protuberance 57 (see FIG. 9A) on the oxidation-resistance film 62, without addition of any special processing step. Accordingly, the SRAM of the present embodiment can be fabricated through manufacturing processes as simple as those through which only transistors whose threshold values for operation are the same are to be formed on a single substrate.

Second Embodiment

Figure 17A:
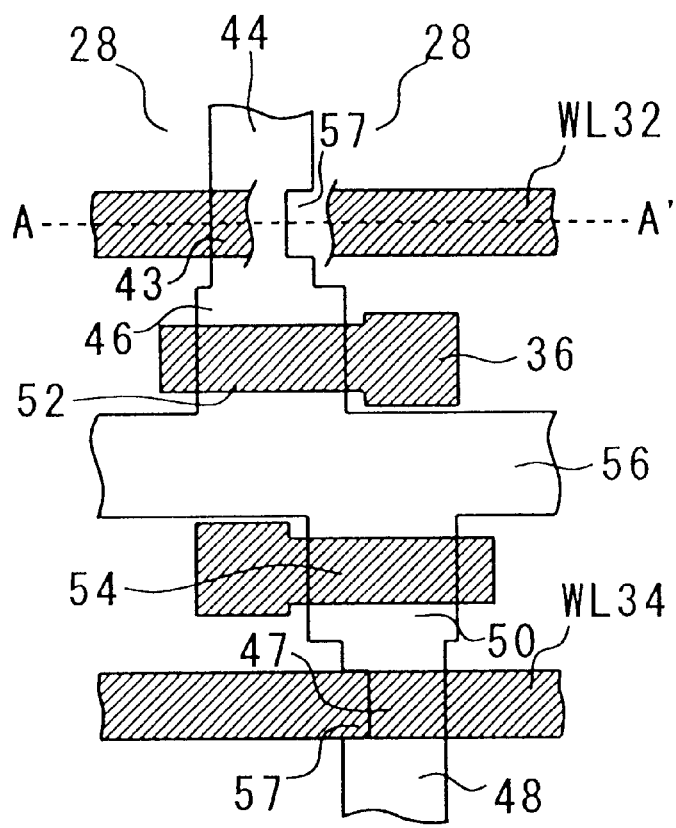
FIG. 17A is a plan view for describing a structure of the SRAM according to the second embodiment.
Figure 17B:
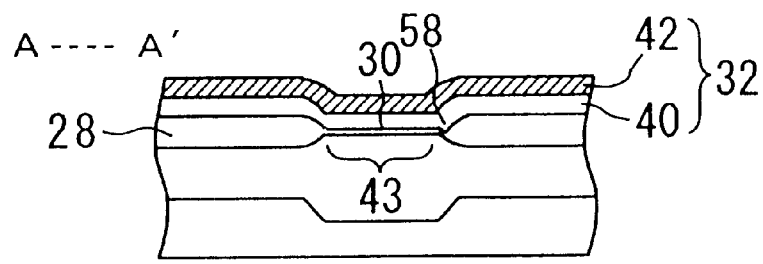
FIG. 17B is a cross-sectional view for describing the structure of the SRAM according to the second embodiment.

SRAM according to a second embodiment of the present invention will now be described by reference to FIGS. 17A and 17B. FIG. 17A is a plan view showing the state of SRAM in a processing step in the course of the manufacturing process according the second embodiment. FIG. 17B is a cross-sectional view of SRAM taken along line B–B' shown in FIG. 17A.

The SRAM of the second embodiment is identical in configuration with the SRAM of the first embodiment, with the exception of the protuberance 57 of the field-oxide film 28 employed in the second embodiment differing in shape from the protuberance 57 of the field-oxide film 28 employed in the first embodiment. In the second embodiment, the protuberance 57 is provided such that the width of the protuberance 57 becomes substantially identical with that of the channel length L of the access transistors A1 and A2 (the lengths of the active regions 43 and 47 in the longitudinal direction shown in FIG. 17A). The protuberance 57 is formed so as to produce a linear boundary region between the respective active regions 43 and 47. The SRAM of the second embodiment can be fabricated through the same procedures as those employed for fabrication of the SRAM of the first embodiment, except that the oxidation-resistance film 62 (see FIG. 9A) is matched with the geometry of the protuberance 57.

The bird's beak arising at the time of formation of the field-oxide film 28 is suppressed in the areas where the field-oxide film 28 is to be protruded. In the second embodiment, the trench 58 is formed at the boundary between the protuberance 57 of the field-oxide film 28 and the active region 43, as in the case of the first embodiment. Accordingly, the SRAM of the second embodiment can yield the same advantageous results as those yielded by the SRAM of the first embodiment.

The shape of the protuberance 57 of the field-oxide film 28 is not limited to the shapes shown in the first and second embodiments. For instance, the protuberance 57 may assume a shape modified from the protuberance 57 of the second embodiment so as to have a circular-arch shaped end face, or a shape modified from the protuberance 57 of the second embodiment so as to have enlarged or reduced width by a certain extent.

Third Embodiment

Figure 18A:
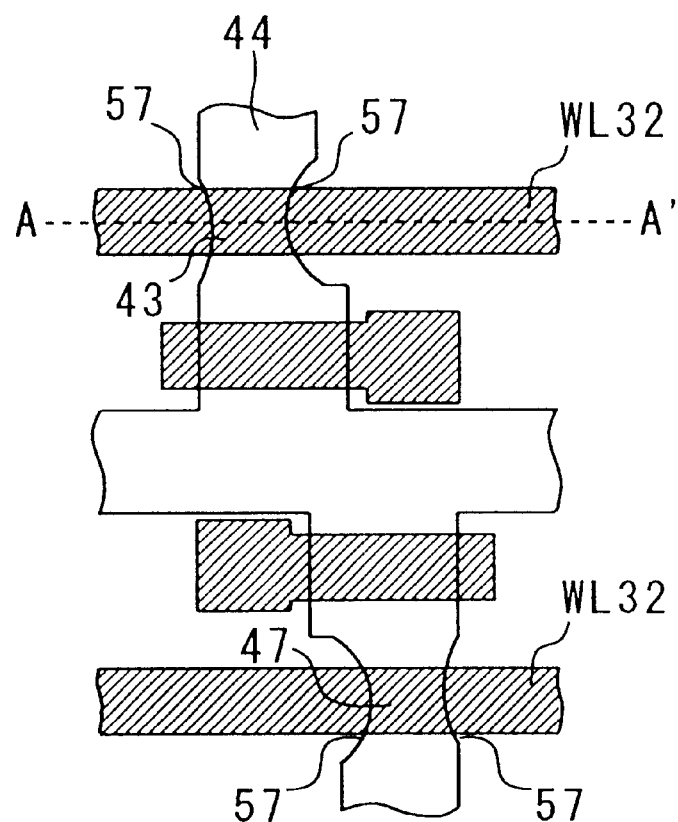
FIG. 18A is a plan view for describing a structure of an SRAM according to a third embodiment.
Figure 18B:
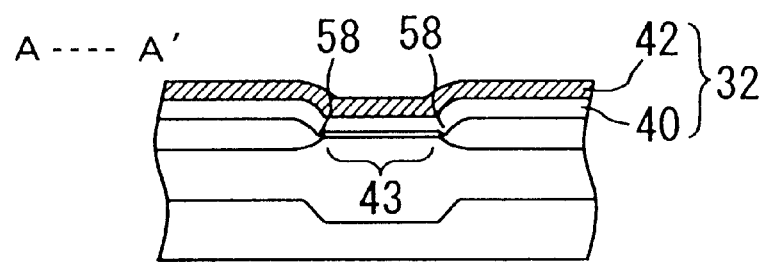
FIG. 18B is a cross-sectional view for describing the structure of the SRAM according to the third embodiment.

Next, description will be given of SRAM according to a third embodiment of the present invention with reference to FIGS. 18A and 18B. FIG. 18A is a plan view showing the state of SRAM in a processing step in the course of the manufacturing process according the third embodiment. FIG. 18B is a cross-sectional view of SRAM taken along line B–B' shown in FIG. 18A.

The SRAM of the third embodiment is identical in structure with the SRAM of the first embodiment, except that the protuberances 57 of the field-oxide film 28 are formed on opposite sides of the respective active regions 43 and 47 whereby the trenches 58 are formed on opposite sides of the same. The SRAM of the third embodiment can be fabricated through the same procedures as those employed for fabrication of the SRAM of the first embodiment, except that the shape of the oxidation-resistance film 62 (see FIG. 9A) is matched with that of the protuberance 57.

When the trenches 58 are formed on opposite sides of the respective active regions 43 and 47, the inversion layer is more easily formed in the active regions 43 and 47, as compared with the case where the trench 58 is formed only on one side of each of the active regions 43 and 47. Accordingly, the present embodiment can reduce the threshold value Vath for operation of the access transistors A1 and A2 to a greater extent compared with the first or second embodiment.

In FIG. 16 showing the relationship between the threshold value Vth for operation of a transistor and the channel width W of the transistor, a characteristic curve 106 designates the characteristic of the transistor, in which the trenches 58 are formed on opposite sides of the channel region. In the SRAM of the third embodiment, the driver transistors D1 and D2 exhibit a characteristic corresponding to the characteristic curve 102, and the access transistors A1 and A2 exhibit a characteristic corresponding to the characteristic curve 106.

The channel width D of the driver transistors D1 and D2 assumes a value of 0.8 $\mu$m, and the channel width WA of the access transistors A1 and A2 assumes a value of 0.4 $\mu$m, as in the case of the first embodiment. In the third embodiment, the threshold value Vdth for operation of the driver transistors D1 and D2 assumes a value of 0.7V; and the threshold value Vath for operation of the access transistors A1 and A2 assumes a value of 0.57V. As mentioned above, the difference between the threshold values Vath for the operation of the access transistors A1 and A2 and the threshold values Vdth for the operation of the driver transistors D1 and D2 can be made greater in the SRAM of the third embodiment than in the SRAM of the first or second embodiment. Accordingly, the SRAM of the third embodiment can achieve an operation characteristic more stable than that of the SRAM of the first or second embodiment.

The major benefits of the present invention described above are summarized as follows:

According to the first aspect of the present invention, there exists a trench inevitably formed during the course of formation of a field-oxide film in a boundary region between a protuberance of the field-oxide film and a channel region of a transistor. If a trench is formed at the edge of the channel region, the threshold value for operation of the transistor can be readily reduced, by utilization of a reverse narrow channel effect. Accordingly, the present invention can embody a semiconductor device which includes transistors whose threshold values for operation can be readily controlled and which can be manufactured through a simple manufacturing process.

According to the second aspect of he present invention, there can be embodies a state suitable for suppressing a bird's beak, which would otherwise arise in the area of a field-oxide film adjacent to a channel region during the course of formation of the field-oxide film. Accordingly, the present invention can embody a semiconductor device having a structure suitable for reliably and readily forming a trench in a boundary region between a channel region and a protuberance.

According to the third aspect of the present invention, trenches are formed on opposite sides of the channel region of the transistor. Thus, the threshold value for the operation of the transistor can be reduced to a sufficiently small value.

According to the fourth aspect of the present invention, there can be embodied SRAM including access transistors whose threshold values for operation assume small values and driver transistors whose threshold values for operation assume values greater than those of the access transistors through a simple manufacturing process.

According to the fifth aspect of the present invention, since the driver transistors have a large channel width, the threshold values for the operation of the driver transistors can be increased. In contrast, since the access transistors have a small channel width, the threshold values for the operation of the access transistors can be reduced. For these reasons, the present invention can embody SRAM which exhibits a stable operation characteristic.

According to the sixth aspect of the present invention, by subjecting a semiconductor substrate to thermal oxidation by utilization of an oxidation-resistance mask whose recesses face the channel regions, there can be readily formed a field-oxide film whose protuberances bulge toward the channel regions and which have trenches formed at the edges of the protuberances. Accordingly, the present invention enables manufacture, through a simple process, of a semiconductor device comprising transistors whose threshold values for operation can be controlled by utilization of a reverse narrow channel effect.

According to the seventh aspect of the present invention, a bird's beak, which would otherwise arise in the area of the field-oxide film adjacent to the channel region during the course of formation of the field-oxide film, can be effectively suppressed. Consequently, according to the present invention, a trench can be readily and reliably formed in a boundary area between the channel region and the protuberance.

According to the eighth aspect of the present invention, concave portions are formed on opposite sides of the oxidation-resistance mask, and hence trenches are inevitably formed on opposite sides of the channel region of the transistor. Accordingly, there can be readily manufactured a transistor whose threshold value for operation assumes a sufficiently small value.

According to the ninth aspect of the present invention, there can be manufactured, through a simple manufacturing process, SRAM including access transistors whose threshold values for operation assume small values and driver transistors whose threshold values for operation assume values greater than those of the access transistors.

According to the tenth aspect of the present invention, the threshold values for operation of the driver transistors can be increased so as to become greater than those for operation of the access transistors, by means of appropriately controlling the channel width of the transistors. Therefore, the present invention enables manufacture of SRAM which exhibits a stable operation characteristic, through a simple manufacturing process.

Further, the present invention is not limited to these embodiments, but variations and modifications may be made without departing from the scope of the present invention.

The entire disclosure of Japanese Patent Application No. Hei 11-243636 filed on Aug. 30, 1999 including specification, claims, drawings and summary are incorporated herein by reference in its entirety.

What is claimed is:

1. A semiconductor device having a field-oxide film for insulating a plurality of active regions from one another, the device comprising:

first and second active regions which are to act as source/drain regions of a transistor; and a third active region which is to be interposed between the first and second active regions and act as a channel region of the transistor, wherein the field-oxide film has a protuberance in a boundary area with the first through third active regions, so as to protrude toward the third active region; and a trench is formed in a boundary region between the protuberance and the third active region, wherein the protuberance of the field-oxide film assumes a circular-arch geometry so as to protrude toward the third active region.

2. The semiconductor device according to claim 1, wherein the protuberance of the field-oxide film is formed such that the minimum width of the third active region is smaller than the minimum width of the first active region and the minimum width of the second active region.

3. The semiconductor device according to claim 1, wherein the total width of the protuberance of the field-oxide film is smaller than the sum of widths of the first through third active regions.

4. The semiconductor device according to claim 1, wherein the protuberances of the field-oxide film and the trenches are formed on both sides of the third active region.

5. The semiconductor device according to claim 1, wherein the transistor corresponds to an access transistor of SRAM comprising access transistors and driver transistors; and the field-oxide film has a long linear portion longer than the channel length of the driver transistors, in boundary regions between active regions which are to act as channel regions of the driver transistors.

6. The semiconductor device according to claim 5, wherein the channel width of the access transistors is smaller than the channel width of the driver transistors.

7. A semiconductor device having a field-oxide film for insulating a plurality of active regions from one another, the device comprising:

first and second active regions which are to act as source/drain regions of a transistor; and a third active region which is to be interposed between the first and second active regions and act as a channel region of the transistor, wherein the field-oxide film has a protuberance in a boundary area with the first through third active regions, so as to protrude toward the third active region; and a trench is formed in a boundary region between the protuberance and the third active region, wherein the protuberance of the field-oxide film is formed such that a bird's beak to be formed in a boundary region between the field-oxide film and the third active region during the course of formation of the field-oxide film becomes smaller than a bird's beak to be formed in a boundary region between the field-oxide film and the first or second active region.

8. The semiconductor device according to claim 7, wherein the protuberance of the field-oxide film is formed such that the minimum width of the third active region is smaller than the minimum width of the first active region and the minimum width of the second active region.

9. The semiconductor device according to claim 7, wherein the total width of the protuberance of the field-oxide film is smaller than the sum of widths of the first through third active regions.

10. The semiconductor device according to claim 7, wherein the protuberances of the field-oxide film and the trenches are formed on both sides of the third active region.

11. The semiconductor device according to claim 7, wherein the transistor corresponds to an access transistor of SRAM comprising access transistors and driver transistors; and the field-oxide film has a long linear portion longer than the channel length of the driver transistors, in boundary regions between active regions which are to act as channel regions of the driver transistors.

12. The semiconductor device according to claim 11, wherein the channel width of the access transistors in smaller than the channel width of the driver transistors.

* * * * *